US006426733B1

(12) United States Patent
Yamada

(10) Patent No.: US 6,426,733 B1
(45) Date of Patent: Jul. 30, 2002

(54) ELECTRON SOURCE SUBSTRATE AND IMAGE-FORMING APPARATUS USING THE SAME

(75) Inventor: Shuji Yamada, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/466,909

(22) Filed: Dec. 20, 1999

(30) Foreign Application Priority Data

Feb. 25, 1999 (JP) .......................................... 11-048046
Dec. 16, 1999 (JP) .......................................... 11-356951

(51) Int. Cl.$^7$ ................................................ G09G 3/22
(52) U.S. Cl. .................................... 345/74.1; 315/169.1
(58) Field of Search ........................ 345/74.1, 75.1, 345/75.2, 76; 315/169.1, 169.3; 313/336, 310, 308, 309, 346 R; 438/20, 26; 445/24

(56) References Cited

U.S. PATENT DOCUMENTS

| | | | | |
|---|---|---|---|---|
| 5,949,393 A | * | 9/1999 | Sakai et al. ..................... | 345/74 |
| 6,034,478 A | * | 3/2000 | Kawade et al. ........... | 315/169.1 |
| 6,137,459 A | * | 10/2000 | Eida et al. ..................... | 345/76 |
| 6,179,678 B1 | * | 1/2001 | Kishi et al. .................... | 445/24 |

FOREIGN PATENT DOCUMENTS

| | | |
|---|---|---|
| JP | 8-34110 | 2/1996 |
| JP | 8-321254 | 12/1996 |

OTHER PUBLICATIONS

M. Elinson, et al. "The Emission of Hot Electrons and the Field Emissions of Electrons From Tin Oxide", Radio Engineering and Electronic Physics, Jul. 1965, pp. 1290–1296.
G. Dittmer, "Electrical Conduction and Electron Emission of Discontinuous Thin Films", Thin Solid Films, 9, 1972 pp. 317–328.
M. Hartwell et al., "Strong Electron Emission From Patterned Tin–Indium Oxide Films", IEDM, 1975, pp. 519–521.
H. Araki, et al., "Electroforming and Electron Emission of Carbon Thin Films", Journal of the Vacuum Soc. of Japan, vol. 2–6, No. 1, 1983, pp. 22–29 (with English Abstract).

* cited by examiner

Primary Examiner—Regina Liang
(74) Attorney, Agent, or Firm—Fitzpatrick, Cella, Harper & Scinto

(57) ABSTRACT

This invention relates to an electron source substrate free from any short-circuiting between upper and lower wires, and an image-forming apparatus in which discharge is suppressed. The electron source substrate includes a substrate, a Y-direction wire formed on the substrate by a printing method, an X-direction wire formed on the Y-direction wire by the printing method so as to intersect the Y-direction wire, an insulating layer for insulating the Y-direction wire and X-direction wire at the intersection part, and a plurality of electron-emitting devices connected to the X-direction wire and Y-direction wire, wherein at least one of the Y-direction wire and X-direction wire has a surface shape with a surface roughness Ra of 0.3 $\mu$m or less and a surface roughness Rz of 3 $\mu$m or less.

6 Claims, 12 Drawing Sheets

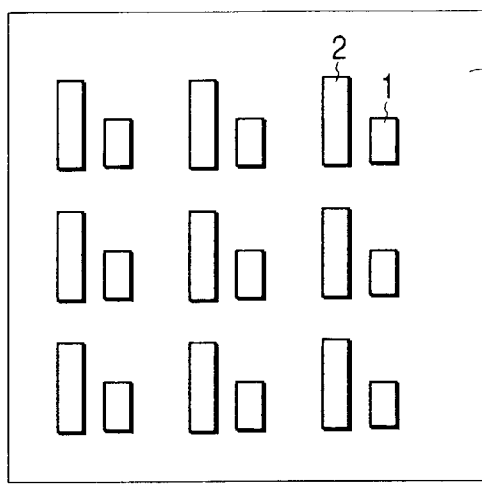
FIG. 1A
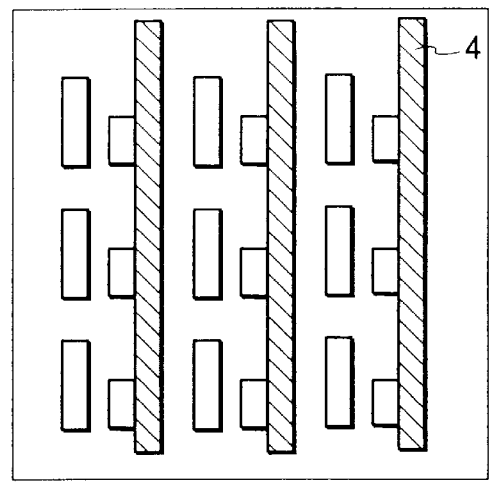
FIG. 1B
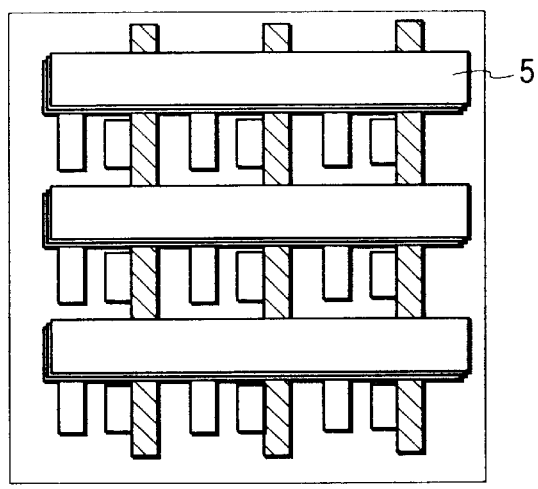
FIG. 1C
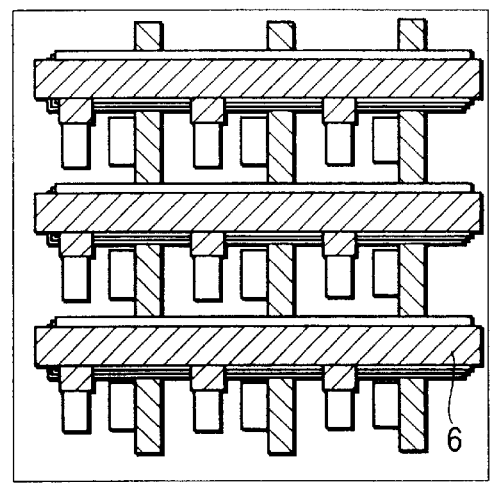
FIG. 1D
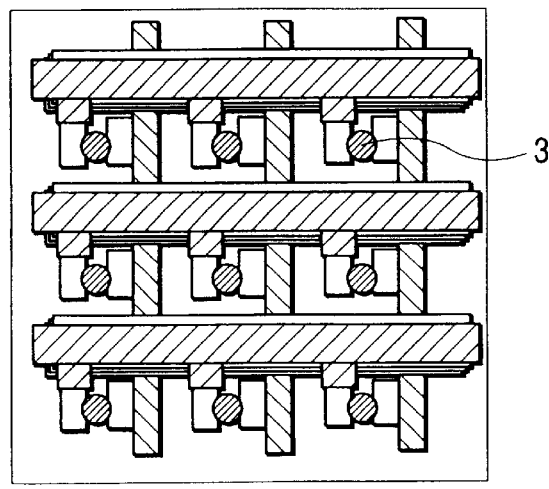
FIG. 1E
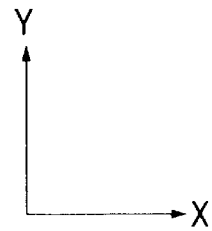

CROSS-SECTIONAL VIEW OF INTERSECTION PART OF
MATRIX WIRING OF PRIOR ART AND COMPARATIVE EXAMPLE

CROSS-SECTIONAL VIEW OF INTERSECTION PART OF
MATRIX WIRING OF THE PRESENT INVENTION

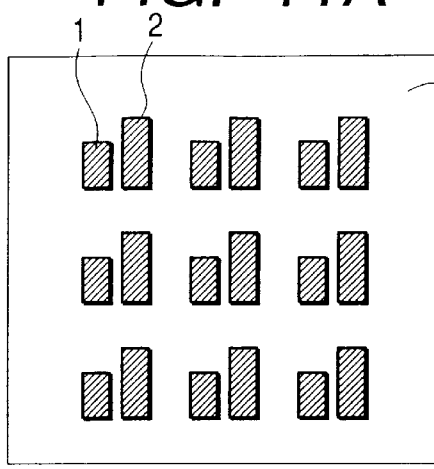
FIG. 11A
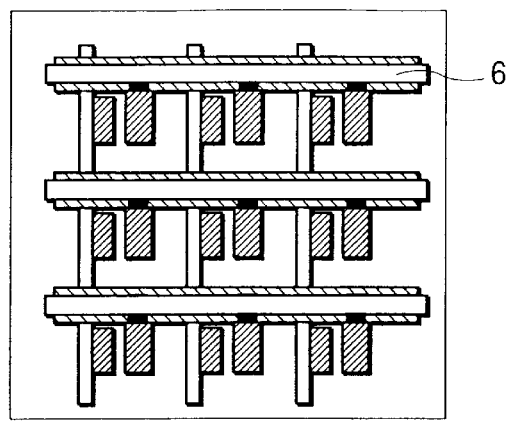
FIG. 11D
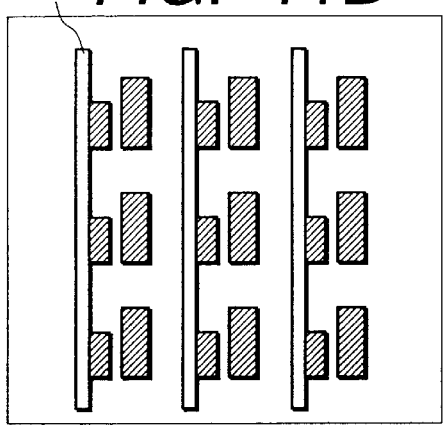
FIG. 11B
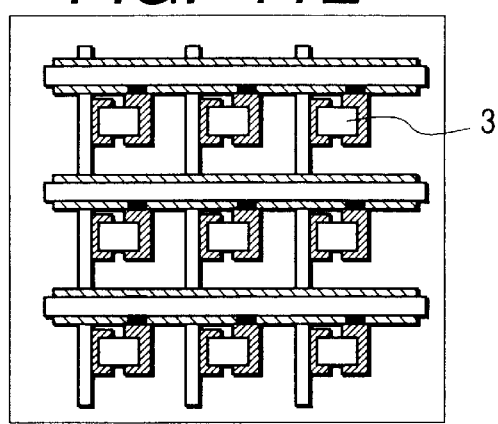
FIG. 11E
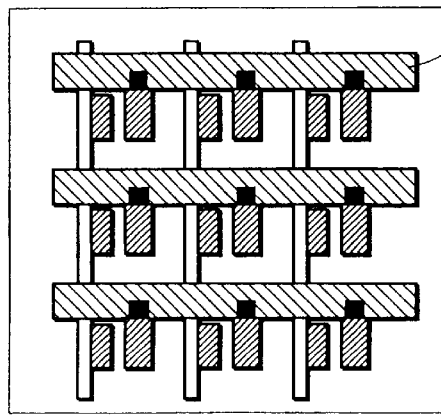
FIG. 11C
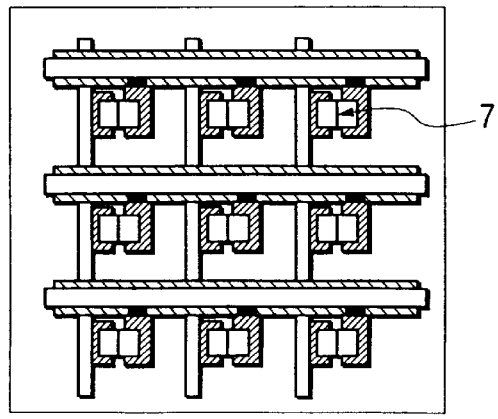
FIG. 11F
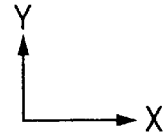

ELECTRON SOURCE SUBSTRATE AND IMAGE-FORMING APPARATUS USING THE SAME

BACKGROUND OF THE INVENTION

1. Field of the Invention

The present invention relates to an electron source substrate, manufacturing method therefor, and image-forming apparatus using the electron source substrate.

2. Related Background Art

In recent years, flat, low-profile image-forming apparatuses have received a great deal of attention as image-forming apparatuses instead of large, heavy cathode ray tubes. As the flat image-forming apparatuses, liquid crystal displays have enthusiastically been studied and developed. However, the liquid crystal displays suffer dark images and narrow angles of field. The substitutes of the liquid crystal displays are emissive displays, i.e., plasma displays, vacuum fluorescent displays, and displays using emissive devices such as a surface conduction electron-emitting device. The emissive display can attain brighter images and wider angles of field than those of the liquid crystal display apparatus. On the other than, cathode ray tubes having a display of 30" or more are being introduced, and are desired to realize larger displays. However, the cathode ray tube is not preferable because a larger one requires a larger space. As a bright, large-size display, the flat emissive display is suitable. The present inventors give attention to an image-forming apparatus using an electron-emitting device among flat emissive type image-forming apparatuses, and particularly to an image-forming apparatus using a surface conduction electron-emitting device capable of emitting electrons with a simple structure, which was proposed by M. I. Elinson et al. (Radio. Eng. Electron. Phys., 10, 1290 (1965)).

The surface conduction electron-emitting device emits electrons by flowing, in parallel with a film surface, a current through a small-area thin film formed on a substrate. Examples of the surface conduction electron-emitting device are a device using an $SiO_2$ thin film proposed by Elinson et al., a device using an Au thin film [G. Dittmer: Thin Solid Films, 9, 317 (1972)], a device using $In_2O_3/SnO_2$ thin film [M. Hartwell and C. G. Fonstad: IEEE Trans. ED Conf., 519 (1975)], and a device using a carbon thin film [Hisashi Araki et al.: Shinkuu (Vacuum), Vol. 26, No. 1, p. 22 (1983)].

As a typical example of these surface conduction electron-emitting devices, the device structure by M. Hartwell is schematically shown in FIG. 2. In FIG. 2, an electroconductive thin film 22 is formed on a substrate 21. The electroconductive thin film 22 is made of a metal oxide thin film or the like sputtered into an H-shaped pattern. The electroconductive thin film 22 undergoes energization operation called energization forming (to be described later) to form an electron-emitting region 24. In FIG. 2, an interval L between device electrodes and W are set to 0.5 to 1 mm and 0.1 mm, respectively.

Another example of the surface conduction electron-emitting device is disclosed in Japanese Laid-Open Patent Application No. 08-321254 or the like. The surface conduction electron-emitting device disclosed in this reference is schematically shown in FIGS. 3A and 3B. FIG. 3A is a schematic plan view of the device, and FIG. 3B is a schematic sectional view taken along the line 3B—3B in FIG. 3A. In FIGS. 3A and 3B, electrodes 2 and 1, electroconductive thin film 3, and electron-emitting region 7 are formed on a substrate 9.

The present inventors have studied a large-area image-forming apparatus having many surface conduction electron-emitting devices arranged on a substrate. An electron source substrate having electron-emitting devices and wires arranged on a substrate can be manufactured by various methods. For example, all device electrodes, wires, and the like are formed by photolithography.

To the contrary, surface conduction electron-emitting devices and an electron source substrate including them can be formed using a printing technique such as screen printing or offset printing. The printing method is suitable for forming a large-area pattern. By forming the device electrodes of surface conduction electron-emitting devices by printing, many surface conduction electron-emitting devices can be easily formed.

Japanese Laid-Open Patent Application No. 8-34110 employs screen printing to form X- and Y-direction wires which are used to drive electron-emitting devices on a rear plate (substrate), and respectively extend in the X and Y-directions, and an insulating layer for insulating the X- and Y-direction wires from each other. An electron source manufacturing method disclosed in this reference will be described with reference to FIG. 11A to FIG. 11F. A plurality of pairs of electrodes 1 and 2 are formed on a substrate 9 (FIG. 11A). An electroconductive paste is applied by screen printing and baked to form wires (y-direction wires) 4 for commonly connecting the electrodes 1 (FIG. 11B). Insulating layers 5 for insulating the wires 4 from wires 6 (to be described later) are formed by applying an insulating paste and baking the paste by screen printing (FIG. 11C). Then, wires (x-direction wires) 6 for commonly connecting the electrodes 2 are formed by applying and baking an electroconductive paste by screen printing (FIG. 11D). An electroconductive film 3 for connecting each pair of electrodes 1 and 2 is formed.(FIG. 11E). An electron-emitting region 7 is formed in each electroconductive film to complete an electron source substrate (FIG. 11F).

According to this method, a low-resistance thick film wire can be manufactured more easily within a shorter operation time per substrate at lower cost, compared to a conventional manufacturing method using photolithography.

In a large-screen, high-resolution plasma display panel (PDP) and a display using a surface conduction electron-emitting device, finer line & space printing is demanded.

SUMMARY OF THE INVENTION

According to the present invention, there is provided an electron source substrate comprising a substrate, a Y-direction wire formed on the substrate by a printing method, an X-direction wire formed on the Y-direction wire by the printing method so as to intersect the Y-direction wire, an insulating layer for insulating the Y-direction wire and X-direction wire at the intersection part, and a plurality of electron-emitting devices connected to the X-direction wire and Y-direction wire, wherein at least one of the Y-direction wire and X-direction wire has a surface shape with a surface roughness Ra of not more than 0.3 µm and a surface roughness Rz of not more than 3 µm.

In the present invention, the X- and Y-direction wires are formed by screen printing. Each electron-emitting device has a pair of electrodes, one of the pair of electrodes is connected to the Y-direction wire, and the other electrode is connected to the X-direction wire.

The X-direction wire and Y-direction wire have a surface shape with a surface roughness Ra of not more than 0.2 µm and a surface roughness Rz of not more than 2 µm.

According to the present invention, there is provided an image-forming apparatus comprising an electron source substrate having a plurality of electron-emitting devices, and an image-forming member, the electron source substrate being the above-described electron source substrate.

The present inventors have made extensive studies to find that interlevel insulating errors (short-circuiting between upper and lower wires) at the intersection part between the Y- and X-direction wires and discharge between the face plate and rear plate depend on the surface shapes of the wires.

As a result of various studies, the present inventors have found that the above-described discharge between the rear plate and face plate can be significantly reduced when the Y- or X-direction wire is formed into a surface shape having a surface roughness Ra of 0.3 μm or less and a surface roughness Rz of 3 μm or less. Particularly when the Y- and X-direction wires are formed into a surface shape having a surface roughness Ra of 0.3 μm or less and a surface roughness Rz of 3 μm or less, discharge is further suppressed, and short-circuiting between the X- and Y-direction wires is suppressed.

Note that Ra represents the average roughness along the center line indicating the surface roughness of industrial products, and Rz represents the average roughness of 10 points indicating the surface roughness of industrial products.

BRIEF DESCRIPTION OF THE DRAWINGS

FIGS. 1A, 1B, 1C, 1D and 1E are plan views, respectively, showing the processes in manufacturing an electron source substrate according to the present invention;

FIGS. 11A, 11B, 11C, 11D, 11E and 11F are schematic views, respectively, showing the processes in manufacturing an electron source;

DETAILED DESCRIPTION OF THE PREFERRED EMBODIMENTS

In forming many electron-emitting devices for display using the above-described printing method, several hundred thousand electron-emitting devices for the conventional NTSC or several million electron-emitting devices for HDTV must be accurately formed. In this case, the reliability of the wires 4 and 6 and insulating layer 5 must be higher.

The insulating layer is desirably formed thick so as to keep its permittivity to a certain degree or less in order to suppress power consumption and heat generation in driving. The insulating layer must be free from pinholes and the like. In many cases, therefore, it is insufficient to form the insulating layer from only one layer by printing. To eliminate any defects such as pinhole short-circuiting at the intersection part between wires in a matrix structure having several hundred thousand intersection parts, the insulating layer may be formed from two or more layers. Even in such multilayered structure, however, X- and Y-direction wires may short-circuit with each other at their intersection part.

The present inventors have extensively studied and observed short-circuiting between wires to find the following facts. That is, most of shorting sections between wires even without any pinholes are caused by projections of an electroconductive substance several to several ten μm in size that exist at the intersection parts between the X- and Y-direction wires 6 and 4 on the surfaces of the lower wires owing to any reason.

Figure 5A:
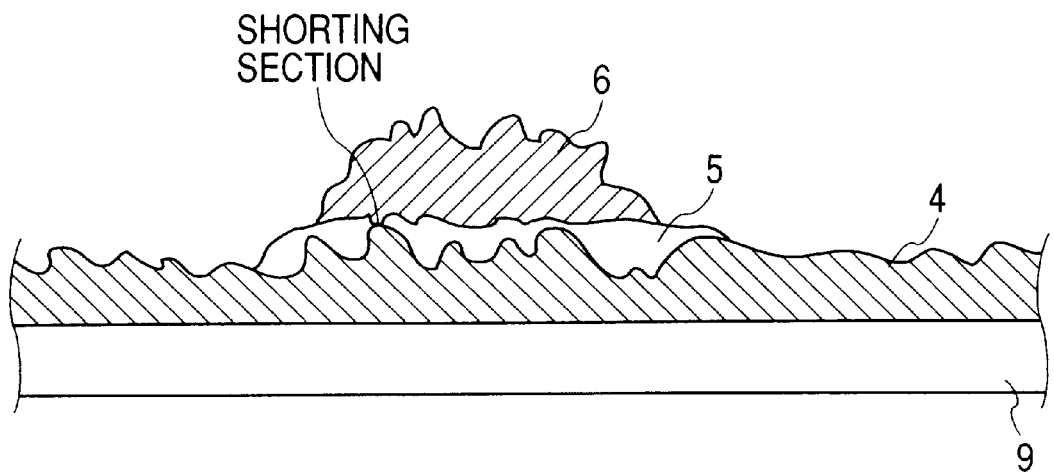
FIGS. 5A and 5B are cross-sectional views each showing the surface roughness of a wire.

FIG. 5A schematically shows the cross-section of an intersection part where the x- and Y-direction wires 6 and 4 short-circuit with each other in the electron source shown in FIGS. 11A to 11F. A projection, which forms the shorting section, is formed by a larger cluster made of fine electroconductive particles of an electroconductive paste that cause secondary aggregation in the paste. In many cases, the projection is a large powder piece of fine electroconductive particles mixed in preparing the electroconductive paste.

In an image-forming apparatus using electron-emitting devices such as surface conduction electron-emitting devices, a substrate called a rear plate having many electron-emitting devices faces, at an interval of several mm, a substrate called a face plate obtained by patterning phosphors (image forming members) of respective R (Red), G (Green), and B (Blue) colors. The space defined by the rear plate and face plate is kept in a reduced-pressure atmosphere. A very high voltage (anode voltage (Va)) of several kV is applied to the face plate in order to irradiate the phosphors on the face plate with electrons emitted by the electron-emitting devices on the rear plate.

To increase the luminance as one of evaluation performance factors of the display, when a phosphor utilizing excitation of an electron beam is used, an anode voltage (Va) as high as possible is desirably applied depending on the selected phosphor. More specifically, the field strength between the face plate and rear plate is desirably 5 kV/mm or more.

At this time, if the above-described projection exists on the wire surface on the rear plate, the electric field concentrates at the projection to discharge between the rear plate and face plate. As a result, a large current may instantaneously flow to destruct the electron-emitting device. This phenomenon becomes more serious to the X-direction wire 6 (see FIGS. 11 and 5A) exposed by a larger area.

It is, therefore, an object of the present invention to provide an electron source substrate which uses high-reliability wires for driving electron-emitting devices, i.e., is almost free from short-circuiting between upper and lower wires, and at the same time to provide an electron source substrate and image-forming apparatus capable of stably increasing the anode voltage (Va) in order to increase the luminance of the image-forming apparatus.

The overview of an electroconductive paste for screen printing preferably used in the present invention will be described.

The electroconductive paste is a dispersion containing at least a fine electroconductive particle powder and vehicle for dispersing the powder. Preferably, the electroconductive paste of the present invention contains a small amount of glass component. This glass component assists tight contact (adhesion) between a glass substrate and the fine electroconductive particle powder and controls sintering of the fine electroconductive particles after the vehicle component is removed by baking upon printing (applying) the electroconductive paste of the present invention on the substrate.

The vehicle is a viscous liquid containing, e.g., a polymer resin such as ethyl cellulose and a solvent such as terpineol.

The electroconductive paste of the present invention has a viscosity adjusted to several ten Pa·sec to several hundred Pa·sec, and is given thixotropic properties to attain good printing characteristics.

To obtain high resolution or high printing speed, additives such as hydrogenated castor oil and its derivative can be mixed to control the rheology of the paste.

Fine electroconductive particles prepared by grinding a generally used solid metal have nonuniform shapes, rough surface, and high surface activity. So, the fine electroconductive particles prepared by grinding readily reaggregate. For this reason, when such fine electroconductive particles are mixed in the paste, they aggregate even upon well kneading, and form large secondary particles like clusters. When a wire pattern is formed by screen printing using this paste, the wire surface becomes rough.

To prevent this, various dispersing agents such as metallic soap may be mixed in the paste, or any surface modification may be done to stabilize the surface of the fine electroconductive particle.

A desirable example of the electroconductive particle of the electroconductive paste preferably used in the present invention is an almost spherical fine particle which is prepared not by grinding a solid metal but by precipitating the particle by neutralization or rapid cooling from an aqueous solution containing a conductor.

When this fine particle is 0.05 $\mu$m or less in size, it readily reaggregates to form a large secondary particle in the paste. When the fine particle is several $\mu$m or more in size, it hardly reaggregates. However, only 10-odd particles form a large cluster, which influences the surface roughness of the wire. An electroconductive paste made of large particles exhibits a high resistance value of the wire owing to weak sintering between particles upon baking.

From this, the fine electroconductive particle used in the electroconductive paste according to the present invention has a diameter of 0.1 $\mu$m to 2 $\mu$m, and more preferably 0.3 $\mu$m to 1.0 $\mu$m. The shape of the fine particle is desirably as spherical as possible.

In the present invention, examples of the polymer resin contained in the electroconductive paste are ethyl cellulose, nitrocellulose, and an acrylic resin.

Examples of the solvent are a terpene alcohol such as menthanol, terpineol, carveol, borneol, or menthandiol, an ether alcohol such as 2-methoxyethanol, 2-ethoxyethanol, 2-butoxyethanol, diethylene glycol monomethyl ether, diethylene glycol monoethyl ether, or diethylene glycol monobutyl ether, and an ester such as ethylene glycol monomethyl ether acetate. Only one of these solvents or a mixture of two or more solvents may be used.

The electroconductive paste preferably used in the present invention desirably contains a small amount of glass component (glass particle). This glass component enhances adhesive properties of fine electroconductive particles to the substrate when the electroconductive paste is baked to remove the vehicle component. This glass component particle is also adjusted to a proper size and diameter so as not to aggregate.

The electroconductive paste preferably used in the present invention is prepared by mixing the above fine electroconductive particles and glass powder in a vehicle component, dispersing the particles and powder by a three-roll mill or the like, and adjusting them into a paste.

At this time, the maximum particle diameter, average particle diameter, and the like are monitored using a gridometer TH-6110 available from Ueshima Seisakusho Co., Ltd. Meanwhile, the dispersion degree is appropriately adjusted, thereby forming a paste which hardly causes secondary aggregation and exhibits a high dispersion degree.

This electroconductive paste is printed by screen printing and baked to realize X- and Y-direction wires having a surface shape with a surface roughness Ra of 0.3 $\mu$m or less and a surface roughness Rz of 3 $\mu$m or less.

However, the present invention can also be satisfied by forming X- and Y-direction wires by conventional printing and polishing their surfaces.

A method of manufacturing an electron source substrate and an image-forming apparatus using it in the present invention will be explained with reference to FIGS. 1A to 1E and FIGS. 3A and 3B. In this case, an electron source substrate using surface conduction electron-emitting devices as electron-emitting devices, and an image-forming apparatus will be exemplified. The electron-emitting device to which the present invention is preferably applied is one which can be driven in a low-pressure atmosphere. The present invention can be preferably applied to an image-forming apparatus using a cold cathode having two terminals, such as a field emission electron-emitting device (to be referred to as an FE), MIM (Metal/Insulator/Metal) electron-emitting device, or surface conduction electron-emitting device. The present invention can be most preferably applied to an image-forming apparatus using a surface conduction electron-emitting device which can be formed with a large area at low cost.

(Step 1)

A conductive film is formed on a well-cleaned substrate 9, and the pattern is processed by photolithography to form pluralities of pairs of device electrodes 1 and 2 (FIG. 1A).

Examples of the substrate 9 are a silica glass substrate, glass substrate having a low impurity content such as Na, soda-lime glass substrate, glass substrate prepared by forming an $SiO_2$ layer on a soda-lime glass by sputtering or the like, and ceramics substrate.

A method of forming the electrodes 1 and 2 can be selected from a method of forming a film using a vacuum system such as vacuum evaporation, sputtering, or plasma CVD, and patterning and etching the film by lithography, and a method of offset-printing an MO paste containing an organic metal using an intaglio plate. As a material for the device electrodes 1 and 2, a general electroconductive material can be used. The general electroconductive material can be properly selected from metals such as Ni, Cr, Au, Mo, W, Pt, Ti, Al, Cu, and Pd, or alloys of these metals, metals such as Pd, Ag, Au, $RuO_2$, and Pd—Ag, a printed conductor made of a metal oxide and glass or the like, a transparent conductor such as $In_2O_3$—$SnO_2$, and a semiconductor material such as polysilicon.

The shape including an interval L between the electrodes 1 and 2, electrode width W1, and width W2 of the electroconductive film 3 is appropriately designed in accordance with an application purpose or the like. The interval L between the electrodes 1 and 2 can be set within the range from several hundred nm to several hundred $\mu$m, and preferably the range from several $\mu$m to several ten $\mu$m. The width W1 of the electrodes 1 and 2 can be set within the range from several $\mu$m to several hundred $\mu$m in consideration of the resistance values of the electrodes and electron-emitting characteristics. A film thickness d of the electrodes 1 and 2 can be set within the range from several ten nm to several $\mu$m.

The electrodes 1 and 2 are formed to reliably electrically connect the electroconductive film 3 and Y- and X-direction wires 6 and 4. This is because even if the electroconductive film 3 is to be directly connected to the wires 4 and 6 (to be described later), they cannot be satisfactorily connected owing to the difference in film thickness.

(Step 2)

Y-direction wires (lower wires) 4 extending in the Y-direction are formed by printing and baking the electroconductive paste of the present invention. At this time, the Y-direction wires 4 are formed to be connected to the device electrodes 2, and more preferably to cover part of the device electrodes 2. After the electroconductive paste is applied into a desired pattern, the obtained structure is baked at a temperature (e.g., 400° C. to 650° C.) corresponding to the thermal characteristics of the paste and glass substrate 9 in order to remove the vehicle component in the paste and sintering the electroconductive particles in the paseste (FIG. 1B).

A thick-film wire is advantageous because it can reduce the electrical resistance. Thus, the present invention adopts screen printing among thick-film printing methods.

According to screen printing, the electroconductive paste is applied to the rear plate through a mask (screen plate) having an opening section corresponding to the pattern of the Y-direction wires (lower wires) 4. The applied paste is dried and baked to remove an unnecessary organic substance in the paste to form the Y-direction wires (lower wires) 4.

A method of applying the paste to the rear plate 9 by screen printing will be explained with reference to FIGS. 7A to 7C and 8.

Figure 7A:
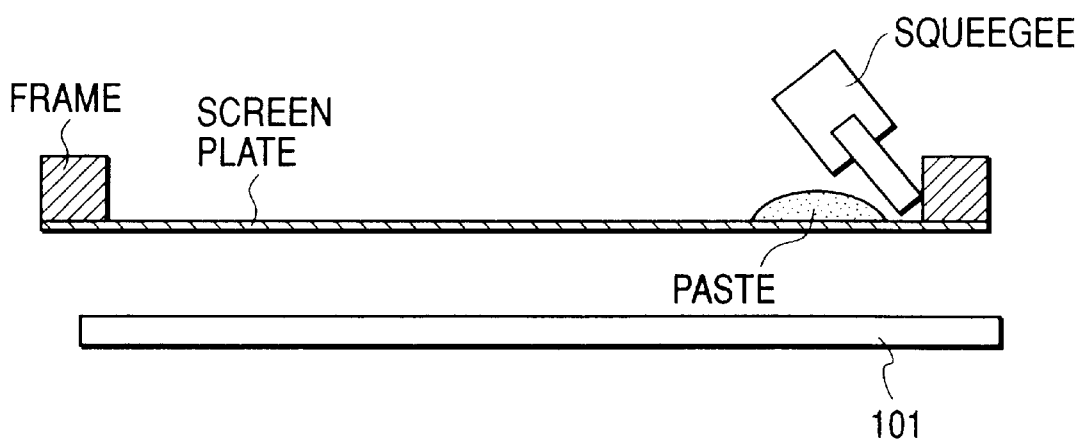
FIGS. 7A, 7B and 7C are schematic views for explaining screen printing.
Figure 8:
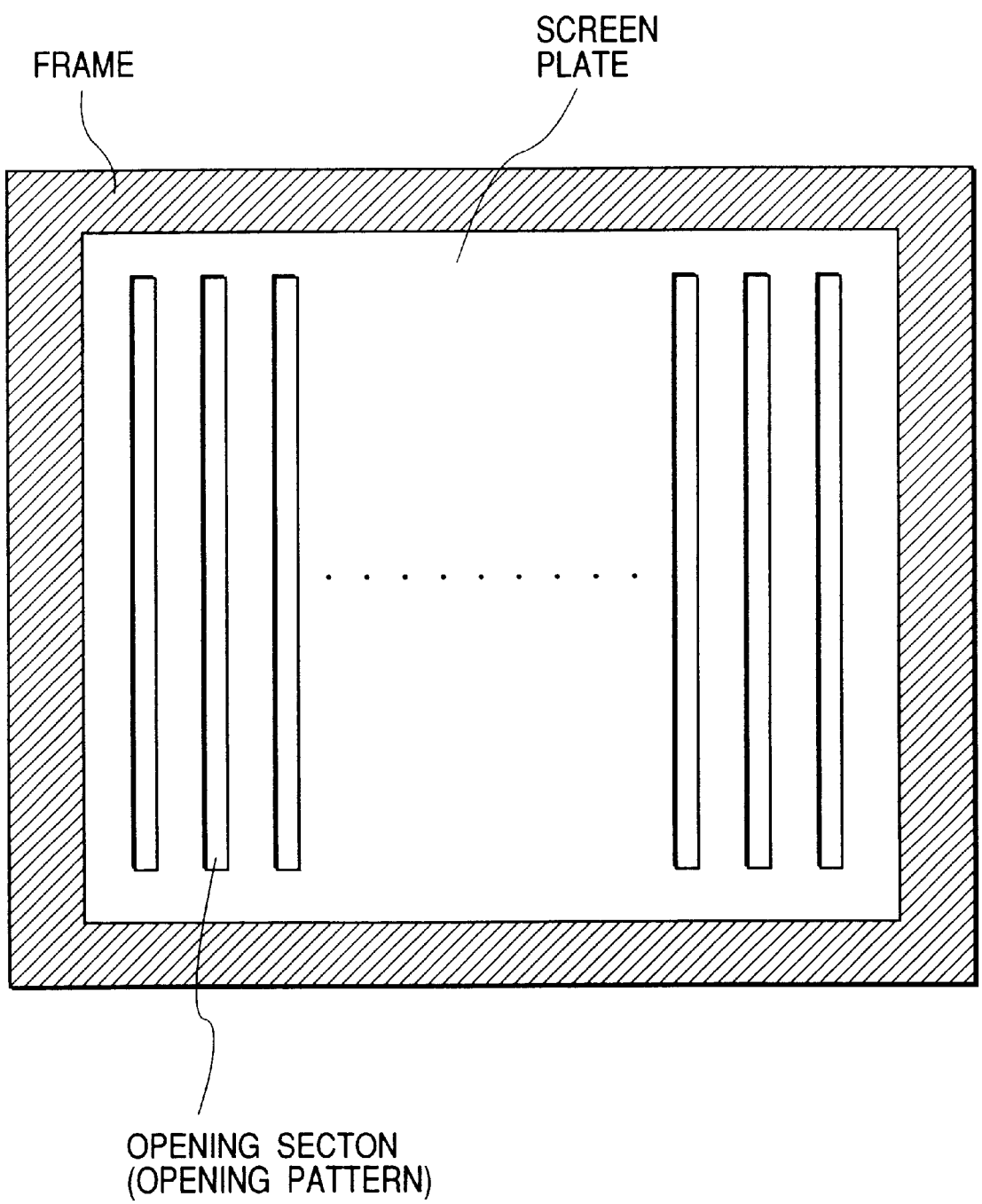
FIG. 8 is a schematic view for explaining a screen plate.

The rear plate 9 formed in step 1 is aligned with the screen plate. The electroconductive paste is set on the screen plate (FIG. 7A). Note that the screen plate has opening sections corresponding to the pattern of the Y-direction wires (lower wires) 4 (FIG. 8).

Figure 7B:
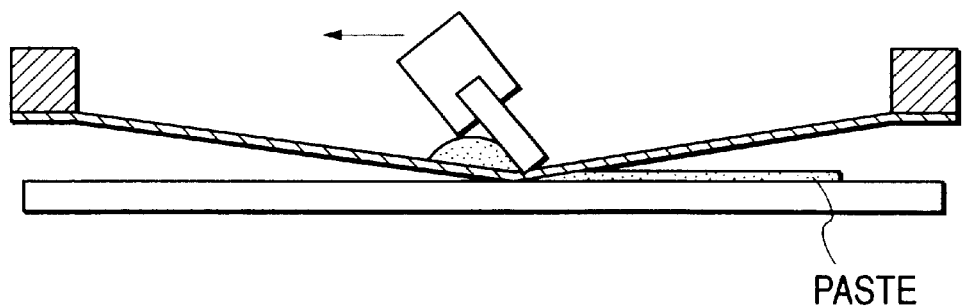
Figure 7C:
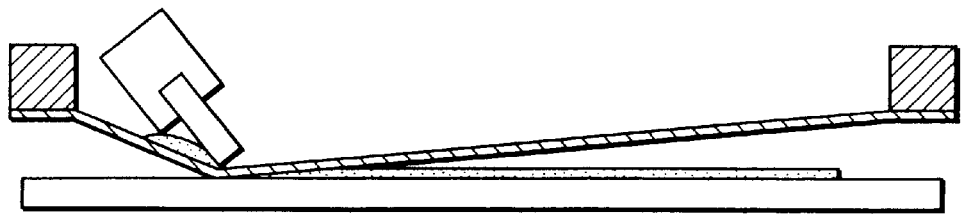

A squeegee is brought into contact with the screen plate and moved in the direction of the arrow shown in FIG. 7B, thereby applying (printing) the electroconductive paste to the rear plate with a desired pattern through the opening sections of the screen plate (FIGS. 7B and 7C).

This method preferably uses an electroconductive paste containing a mixture of electroconductive particles selected from silver, gold, copper, nickel, and the like. More preferably, when higher-resolution patterning is required, a photosensitive material is mixed in the electroconductive paste, a rough pattern is formed by screen printing, and then the pattern is exposed and developed to obtain fine wires. This can preferably reduce the waste amount of photosensitive electroconductive paste.

(Step 3)

An insulating layer 5 is formed at the intersection part of each Y-direction wire (lower wire) 4 and each X-direction wire (upper wire) 6 (FIG. 1C). This insulating layer is made of a glass substance mainly containing lead oxide or the like, for example, a mixture of components appropriately selected from PbO, $B_2O_3$, ZnO, $Al_2O_3$, $SiO_2$, and the like. The thickness is not particularly limited so long as the insulating layer 5 can ensure insulating properties. The thickness is generally set to 10 to 100 $\mu$m, and preferably 20 to 50 $\mu$m. This insulating film is formed by applying, to a predetermined position by screen printing or the like, an insulating paste prepared by mixing a vehicle containing a polymer substance such as ethyl cellulose, organic solvent, and the like with low-melting glass particles mainly containing lead oxide. The applied paste is baked to remove organic components such as the vehicle and to sinter the glass particles, thereby forming an insulating layer. To more reliably attain insulating properties, the insulating layer is preferably made up of a plurality of layers. More specifically, a plurality of insulating layers can be formed by repeating the printing step and baking step using the insulating paste. FIG. 1C shows respective layers offset from each other in order to more clearly illustrate a plurality of insulating layers.

Note that the insulating layer suffices to cover at least the intersection part between the Y- and X-direction wires. Thus, the shape of the insulating layer is not limited to the one shown in FIG. 1C, and can be properly selected.

(Step 4)

X-direction wires (upper wires) 6 are formed on the interlevel insulating layers 5. Since the electrical resistances of these wires are also preferably reduced, the present invention adopts screen printing capable of forming a thick film.

Similar to the method of forming the Y-direction wires, the electroconductive paste used in forming the Y-direction wires is printed and baked (FIG. 1D). At this time, the wires are formed to be connected to the device electrodes 1, and more preferably to cover part of each device electrode 2.

(Step 5)

Electroconductive films 3 are formed. Examples of a material for the electroconductive film 3 are metals such as Pt, Ru, Ag, Pd, Au, Ti, In, Cu, Cr, Fe, Zn, Sn, Ta, W, and Pb, oxides such as PdO, $SnO_2$, $In_2O_3$, PbO, and $Sb_2O_3$, borides such as $HfB_2$, $ZrB_2$, $LaB_6$, $CeB_6$, $YB_4$, and $GdB_4$, carbides such as TiC, ZrC, HfC, TaC, SiC, and WC, nitrides such as TiN, ZrN and HfN, semiconductors such as Si and Ge, and carbons. The material is preferably Pd because the resistance value can be easily adjusted by oxidation and reduction in terms of forming operation (to be described later).

The thickness of the electroconductive film 3 is properly set in consideration of step coverage for the electrodes 1 and 2, the resistance values of the electrodes 1 and 2, forming conditions (to be described later), and the like. In general, this thickness is set preferably to the range from 1 nm to several hundred nm, and more preferably the range from 1 nm to 50 nm. A resistance value Rs is $10^2$ to $10^7$ $\Omega/\square$. This resistance value Rs is obtained when a resistance R of a thin film having a thickness t, width w, and length L is given by R=Rs(L/w).

The thicknesses of the electrodes 1 and 2 are designed in consideration of the thickness of the electroconductive film 3.

The electroconductive film 3 is very thin. If this film 3 is formed before forming wires and electrodes, the film may aggregate owing to the baking temperature in forming the wires and electrodes. For this reason, the electroconductive film is preferably formed after forming the electrodes 1 and 2 and wires 4 and 6. Since the electrodes 1 and 2 are thicker than the electroconductive film but much thinner than the wires 4 and 6, the electrodes are preferably formed on the rear plate before forming the wires. Hence, the formation order is the formation step of the electrodes (1, 2)→the formation step of the wires (4, 6) and insulating layer (5)→the formation step of the electroconductive film (3). The wires and electrodes are preferably connected by partially covering the electrodes with the wires.

A method of forming these electroconductive films 3 is preferably an ink-jet method. The ink-jet method uses a very simple principle and arrangement, and has many advantages such as a high speed and small ink droplet.

More specifically, an organic metal compound solution containing the above electroconductive material is applied to a predetermined position and dried. Then, the organic metal compound is thermally dissolved by baking to form the electroconductive film 3 made of the metal or metal oxide (FIG. 1E).

The ink-jet method includes the following methods (BJ (Bubble-Jet) method and PJ (Piezo-Jet) method). According to the BJ method, a heating resistance element is buried in a nozzle, a liquid is boiled by the heat of the element, and droplets are ejected by the pressure of the bubbles. According to the PJ method, an electrical signal is applied to a piezoelectric element to deform it, and the volume of a liquid chamber is changed to eject droplets. By these methods, a liquid containing a material for forming the electroconductive film is ejected and applied to a position where the electroconductive film is to be formed.

Figure 12A:
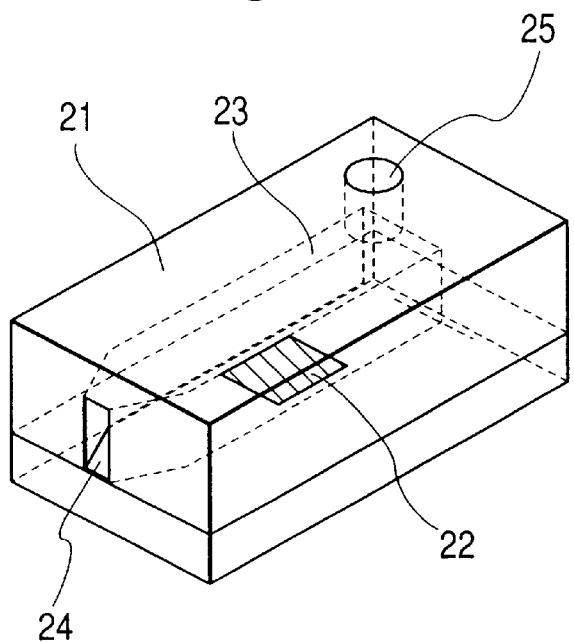
FIGS. 12A and 12B are schematic views, respectively, showing an ink-jet apparatus.
Figure 12B:
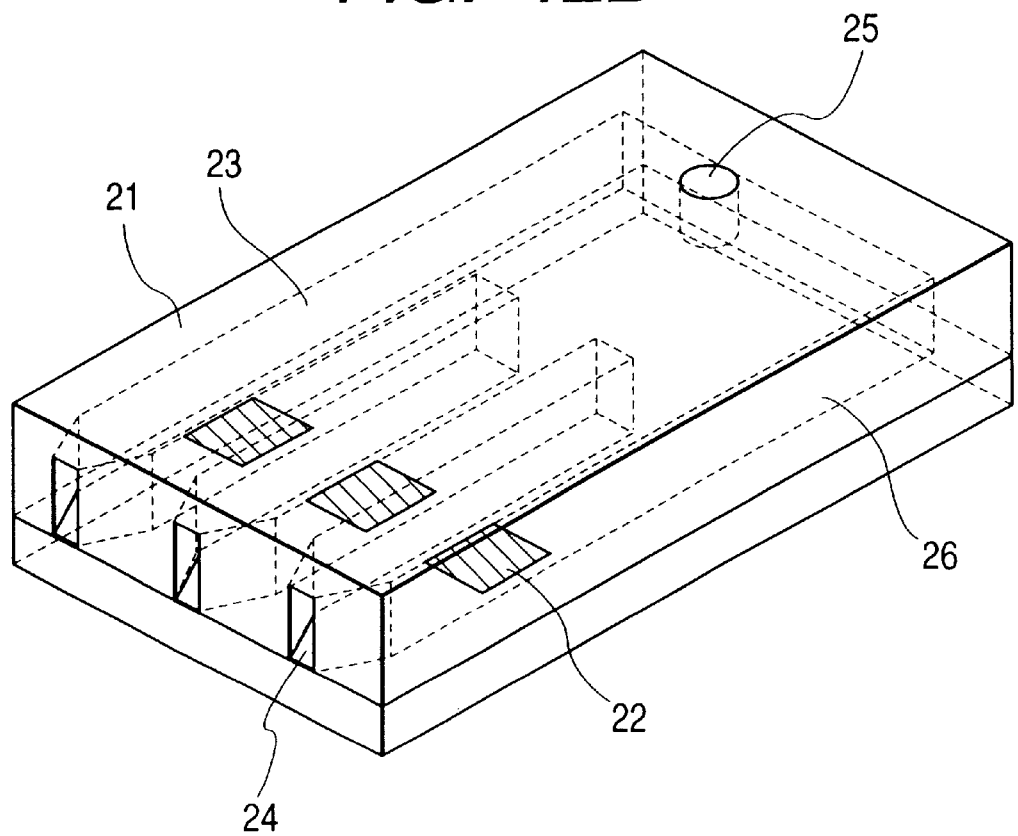

FIGS. 12A and 12B are schematic views each showing an ink-jet head (discharge device) used in the ink-jet method. FIG. 12A shows a single-nozzle head 21 having only one ejection port (nozzle) 24. FIG. 12B shows a multi-nozzle head 21 having a plurality of droplet ejection ports (nozzles) 24. The multi-nozzle head is particularly effective because it can shorten the time required to apply the liquid in manufacturing a display on which a plurality of devices must be formed on a substrate. In FIGS. 12A and 12B, the head 21 comprises a heater or piezoelectric element 22, ink (liquid) passage 23, ink (liquid) supply portion 25, and ink (liquid) reservoir 26. An ink (liquid) tank is set apart from the head 21. The tank and head 21 are connected by the ink supply portion 25 through a tube.

The liquid which can be used in the ink-jet method includes a dispersion particles of the above-mentioned material, and a solution containing a compound such as the complex of the above-mentioned material. However, the liquid is not limited to them.

By the above steps, an electron source substrate before forming operation is formed.

A structure and manufacturing method of an image-forming apparatus having a simple matrix array will be described with reference to FIG. 4.

After the electron source substrate 9 having many electron-emitting devices before forming, as shown in FIGS. 1A to 1E, is fixed onto a rear plate 42, a face plate 43 (constituted by forming a phosphor film 45 and metal back 46 on the inner surface of a glass substrate 44) is set 5 mm above the electron source substrate 9 through a support frame 47. The face plate 43, support frame 47, and rear plate 42 are sealed by a bonding member such as frit glass to form an envelope 411.

The electron source substrate 9 is also fixed to the rear plate 42 with the frit glass.

Figure 4:
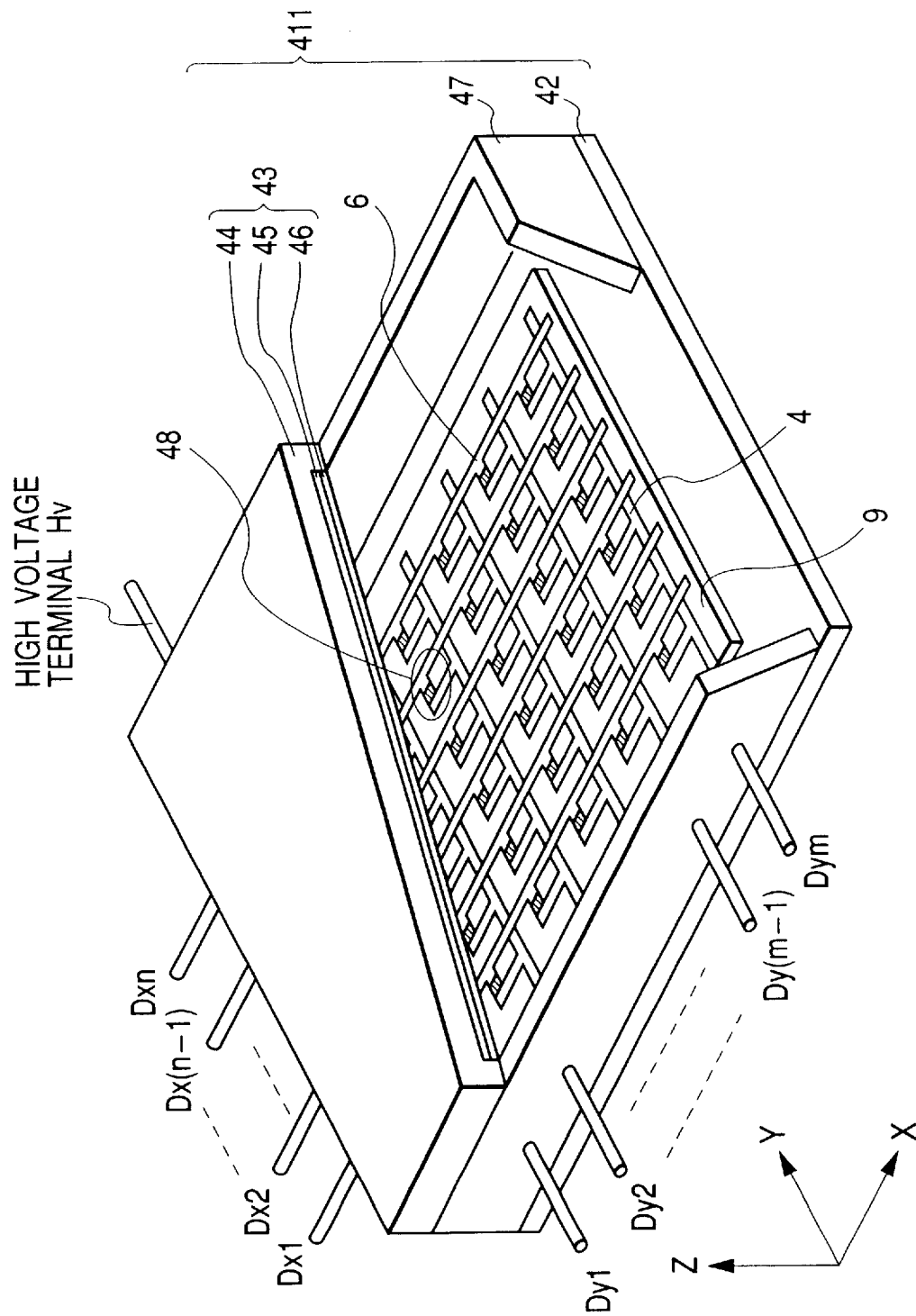
FIG. 4 is a perspective view showing an image-forming apparatus according to the present invention.

In FIG. 4, the image-forming apparatus comprises electron-emitting devices 48, and the X- and Y-direction wires 6 and 4. Note that the electron source substrate 9 and rear plate 42 may be formed from the same substrate.

On the phosphor film 45, phosphors adopt a stripe shape. After black stripes are formed, phosphors of respective colors are applied to the intervals between the black stripes to form the phosphor film 45. An example of a black stripe material is a material mainly containing normal graphite. A slurry method is used as a method of applying phosphors to the glass substrate 44. The metal back 46 is generally formed on the inner surface of the phosphor film 45. The metal back is formed by performing smoothening operation (generally called filming) on the inner surface of the phosphor film after the phosphor film is formed, and depositing aluminum by vacuum evaporation. When the rear plate and face plate are to be sealed, phosphors of the respective colors and electron-emitting devices are satisfactorily aligned with each other in order to make them coincide with each other.

As described above, the electron source substrate 9 before the forming operation was made.

(Step 6)

Energization operation called energization forming (forming operation) is done between the electrodes 1 and 2 by applying a voltage from a power supply (not shown) through Dx1 to Dxn connected to the X-direction wires and Dy1 to Dym connected to the Y-direction wires. Then, the current flows through each electroconductive film to form a gap in part of the electroconductive thin film 3. Examples of a voltage waveform for energization forming are shown in FIGS. 6A and 6B.

The voltage waveform is preferably a pulse-like waveform. Pulses may be applied successively while the pulse peak value is kept at a constant voltage (FIG. 6A). Alternatively, voltage pulses may be applied while the pulse peak value is increased (FIG. 6B). The case in which the pulse peak value is kept at a constant voltage, FIG. 6A, will be explained.

Figure 6A:
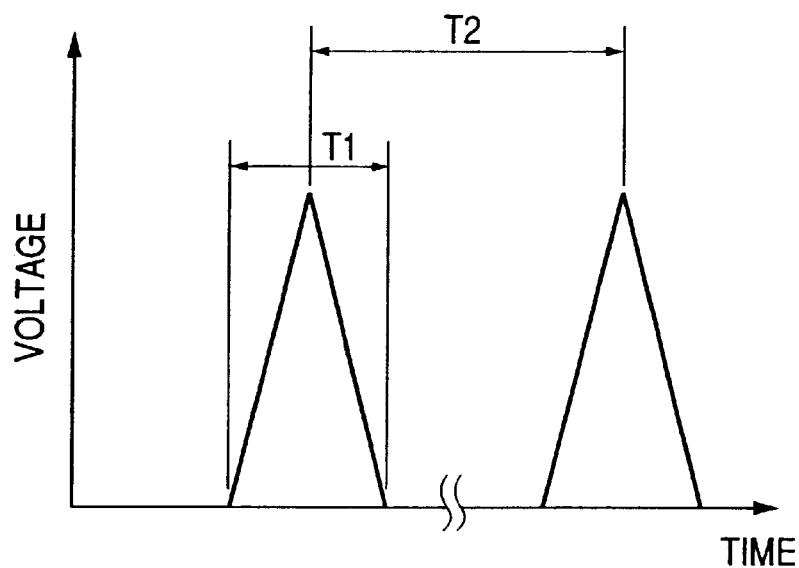
FIGS. 6A and 6B are charts each showing an application voltage waveform in energization forming operation.
Figure 6B:
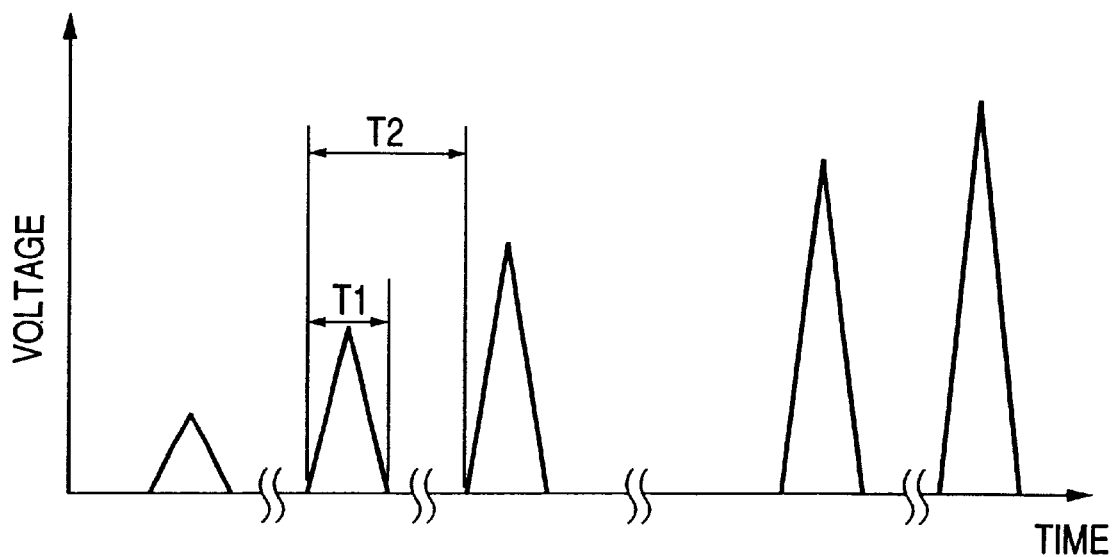

T1 and T2 in FIG. 6A represent the pulse width and pulse interval of the voltage waveform, respectively. T1 is set to 1 $\mu$sec to 10 msec, and T2 is set to 10 $\mu$sec to 100 msec. The peak value of a triangular wave (peak voltage in energization forming) is appropriately selected in accordance with the shape of the electron-emitting device. For example, the peak value is about 4 V to 10 V.

Forming operation is executed by applying this voltage waveform for several sec to several ten sec while the envelope 411 is at a proper vacuum degree, e.g., $10^{-3}$ Pa. The waveform applied between the electrodes of the device is not limited to a triangular waveform and can be a desired waveform such as a rectangular waveform.

T1 and T2 in FIG. 6B represent the pulse width and pulse interval, similar to FIG. 6A. While the peak value of the triangular wave is increased by a step of, e.g., about 0.1 V, the triangular waveform is applied in a proper vacuum degree.

The end of energization forming is determined as follows. A device current is measured to obtain a resistance value at a voltage of, e.g., about 0.1 V so as not to locally destruct or deform the electroconductive thin film 3 during the pulse interval T2. For example, when the resistance value exhibits 1 M$\Omega$ or more, energization forming ends.

(Step 7)

Operation called an activation step is preferably performed for the device which has undergone energization forming. In the activation step as well as forming, a pulse-like voltage is repeatedly applied to the device, while the envelope 411 contains an organic gas of $10^{-2}$ to $10^{-3}$ Pa.

In activation operation, carbon or a carbon compound (carbon film) derived from a small amount of organic compound is deposited on the substrate in the gap formed by the forming operation and on the electroconductive film 3 near the gap, and a device current If and emission current Ie of the electron-emitting device are greatly changed. As a result of the activation step, an electron-emitting region 7 is formed.

Figure 2:
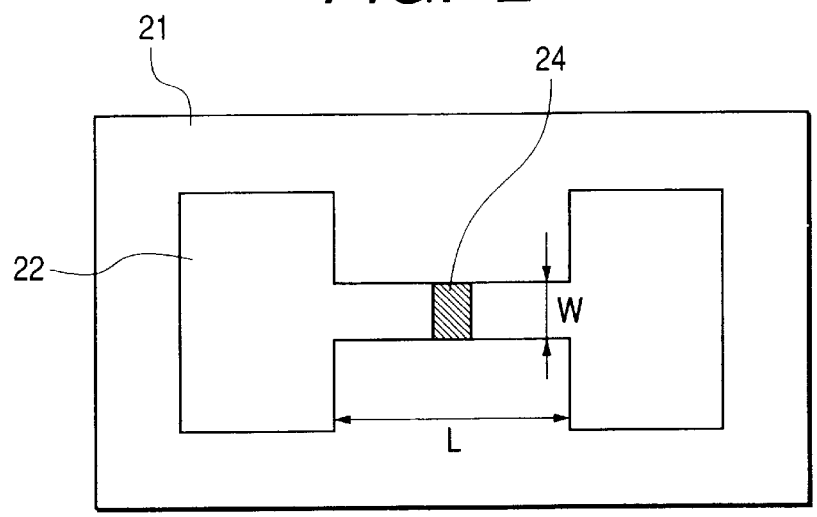
FIG. 2 is a schematic view showing a conventional surface conduction electron-emitting device.
Figure 3A:
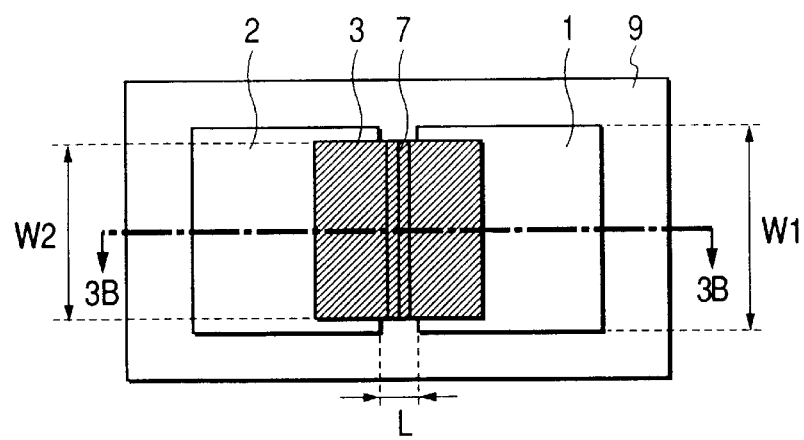
FIGS. 3A and 3B are a plan view and sectional view, respectively, showing another example of the surface conduction electron-emitting device.
Figure 3B:
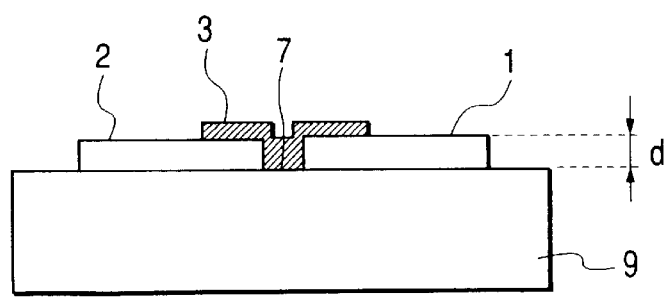

The structure of the surface conduction electron-emitting device in the present invention is basically the same as that shown in FIGS. 3A and 3B.

Activation ends when the emission current Ie substantially saturates. The pulse peak value is preferably an operation driving voltage.

Note that carbon and a carbon compound are graphite (representing both graphite monocrystalline and graphite polycrystalline) and amorphous carbon (representing amorphous carbon and a mixture of amorphous carbon and graphite polycrystalline).

The interior of the envelope 411 incorporating the electron-emitting devices 48 formed in this manner is evacuated through an exhaust pipe (not shown) to a vacuum degree preferably higher than those in the forming step and activation step. The exhaust pipe is heated and sealed to complete the envelope (vacuum vessel) 411 in which a high vacuum is maintained. By applying a voltage to the terminals (Dy1 to Dym and Dx1 to Dxn) and high-voltage terminal Hv extending from the envelope, the respective electron-emitting devices are driven to display an image. The high-voltage terminal Hv is connected to an electrode (anode electrode: metal back) for accelerating electrons to the image-forming member (phosphor) facing the electron source, and irradiating the image-forming member with the electrons.

In this case, the surface shapes of both the X- and Y-direction wires 6 and 4 have a surface roughness Ra of 0.3 μm or less and a surface roughness Rz of 3 μm or less.

However, discharge upon applying a high electric field of 5 kV/mm or more between the rear plate and face plate can be suppressed by setting the surface shape of at least X- or Y-direction wire 6 or 4 to a surface roughness Ra of 0.3 μm or less and a surface roughness Rz of 3 μm or less. To suppress discharge, the X-direction wire, which is arranged closer to the anode and exposed by a larger area, preferably has surface roughnesses falling within the above ranges. More preferably, both the X- and Y-direction wires have surface roughnesses falling within the above ranges.

To eliminate any short-circuiting at the intersection part between the X- and Y-direction wires, the Y-direction wire arranged lower (substrate 9 side) preferably has surface roughnesses falling within the above ranges.

From this, as the most preferable form of the present invention, the surface shapes of the X- and Y-direction wires are set to a surface roughness Ra of 0.3 μm or less and a surface roughness Rz of 3 μm or less.

Note that the vacuum degree higher than that in manufacturing the electron-emitting device, electron source, display panel, and image-forming apparatus in the forming step and activation step is a vacuum degree of about $10^{-5}$ Pa or more, and more preferably an ultra-high vacuum degree at which no carbon or carbon compound is newly deposited. This can suppress deposition of any carbon and carbon compound, and stabilizes the device current If and emission current Ie.

The present invention will be exemplified in detail, but is not limited to the following examples.

EXAMPLES 1 TO 5

Comparative Examples 1 to 3

In Examples 1 to 5 and Comparative Examples 1 to 3, as shown in FIGS. 1A to 1E, 720 Y-direction wires 4 and 240 X-direction wires were formed on a substrate 9 via insulating layers 5 by screen printing.

Table 1 shows the paste used in Examples 1 to 5 and Comparative Examples 1 to 3, and the surface roughnesses of formed wires.

The electroconductive paste used in Examples 1 to 5 and Comparative Examples 1 to 3 was prepared by mixing an organic vehicle, silver particles, a small amount of glass powder, and various additives, and dispersing them by a three-roll mill.

The organic vehicle was prepared by dissolving ethyl cellulose in butyl carbitol acetate (BCA). The glass powder had a softening point of about 500° C. and a particle diameter of about 1.0 μm.

The silver particle used in Examples 1 to 5 was formed by liquid phase epitaxy of reducing an aqueous solution containing silver ions and precipitating metal silver in the solution. Examples of the silver ion solution are an aqueous ammine silver chloride solution, aqueous silver nitrate solution, and silver carbonate solution. Examples of the reducing agent are thiourea dioxide, sodium borohydride, formalin, and hydrazin. Examples 1 to 5 adopted an aqueous ammine silver chloride solution and hidrazin hydrate (98%-$(NH_2)_2H_2O$ available from Wako Pure Chemicals Industries Ltd).

The silver particle used in Comparative Example 1 was a flaky silver powder TCG-1 available from Tokuryoku Kagaku Kenkyujyo. The silver particle used in Comparative Examples 2 and 3 was an indefinite particle prepared by grinding rough silver particles by a ball mill. The ground particle had an uneven surface and low uniformity, and readily secondarily aggregated.

The screen plate used in screen printing was an SX300 mesh having an emulsifying agent thickness of 15 μm available from Tokyo Process Service. The prepared pattern was like the one shown in FIGS. 1A to 1E, and used to form 720 Y-direction wires (lower wires) 4 having a pitch of 230 μm and a wire width of 110 μm, and 240 X-direction wires 6 having a pitch of 690 μm and a wire width of 240 μm. These wires were baked at a baking temperature of 400° C. to 520° C.

The interlevel insulating layers 5 were formed by repeating printing and baking three times using an NP-7730 paste available from Noritake Co., Ltd. The interlevel insulating layer 5 had a thickness of about 20 μm at the intersection part between the wires.

In this arrangement, the number of intersection parts between the Y- and X-direction wires was 172,800.

The reliability of the insulating layer, i.e., short-circuiting between the upper and lower wires were checked by checking the presence/absence of shorting sections at all the intersection parts. The surface roughnesses (Ra and Rz) of the Y- and X-direction wires were measured.

TABLE 1

|  | Example 1 | Example 2 | Example 3 | Example 4 | Example 5 | Comparative Example 1 | Comparative Example 2 | Comparative Example 3 |
| --- | --- | --- | --- | --- | --- | --- | --- | --- |
| Particle Diameter ($\mu$m) | 1.0 | 0.1 | 0.3 | 0.5 | 0.8 | 3.0 | 0.1 | 5.0 |
| Particle Shape | Spherical | Spherical | Spherical | Spherical | Spherical | Flaky | Indefinite (ground) | Indefinite (ground) |
| Ra ($\mu$m) | 0.292 | 0.268 | 0.198 | 0.177 | 0.161 | 0.355 | 0.467 | 0.367 |
| Rz ($\mu$m) | 2.854 | 2.571 | 1.916 | 1.884 | 1.818 | 0.353 | 4.122 | 3.45 |
| Number of Shorting Sections | 0 | 0 | 0 | 0 | 0 | 6 | 10 | 5 |

Figure 5B:
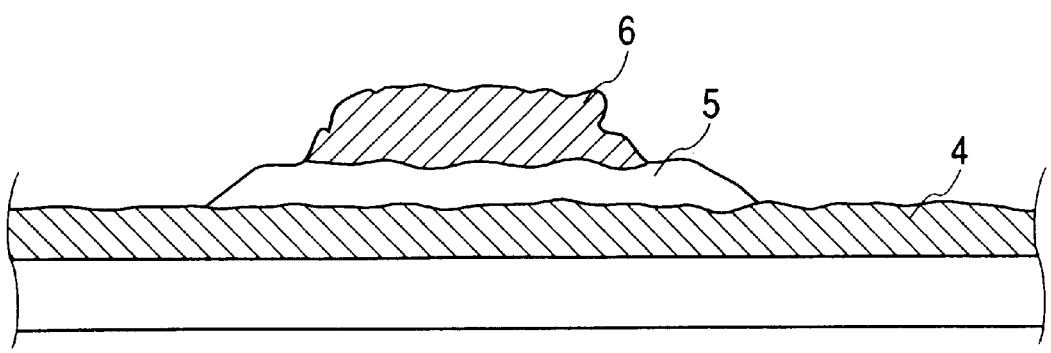

As shown in Table 1, when Ra is 0.3 $\mu$m or less and Rz is 3 $\mu$m or less, no shorting sections exist, and the wire insulating reliability is improved. FIG. 5B schematically shows the state in which the cross-section of the intersection part of matrix wiring formed in Examples 1 to 5 was observed. FIG. 5A schematically shows the state in which the cross-section of a short-circuiting intersection part of matrix wiring formed in Comparative Examples 1 to 3 was observed. In Examples 1 to 5, the wire roughness was suppressed compared to Comparative Examples 1 to 3, similar to the measured surface roughness. In addition, no large projection which might cause short-circuiting was observed.

Each of Ra and Rz was the same in both the directions of length (longitudinal) and width of the wire.

In Examples 1 to 5 and Comparative Examples 1 to 3, the surface roughness of the wire was measured based on a contact type surface roughness measurement method JIS-B0651 using AS-500 available from KLA-Tencor. In measurement, the scan rate, needle pressure, cutoff value, and scan length were 300 $\mu$m/sec, about 3 mg, 0.8 mm, and 2.5 to 2.8 mm, respectively.

The definition of Ra and Rz is given by JIS-B601.

Scan operation was done along the direction of length (longitudinal) of the wire from almost the center of the wire in the direction of width.

EXAMPLE 6

Using the paste used in Comparative Example 1, Y-direction wires (lower wires) 4 were formed by screen printing. Then, the upper surfaces of the wires were polished with a tape.

Tape polishing used a polishing tape (available from Fujifilm) obtain ed by forming an ROI-based abrasive layer having a particle size of 2 $\mu$m on a 0.2 m-thick PET (PolyEthylene Terephthalate) layer. While applying a pressure and winding up the tape, the surface was polished. The surface was polished by moving the tape head right and left at a tape feed rate of 200 mm/min, substrate feed rate of 60 m/min, and pressure of 3 Kgf/cm$^2$ by four pass operations. The longitudinal wire had a surface roughness Ra of 0.131 and a surface roughness Rz of 1.484.

Interlevel insulating layers and X-direction wires were formed and baked similar to Example 1. Then, the number of shorting sections between the upper and lower wires was checked to find that no shorting sections existed and high-reliability interlevel insulating was attained. The roughnesses (Ra and Rz) were measured by the same method as in Example 1.

EXAMPLE 7

Figure 13:
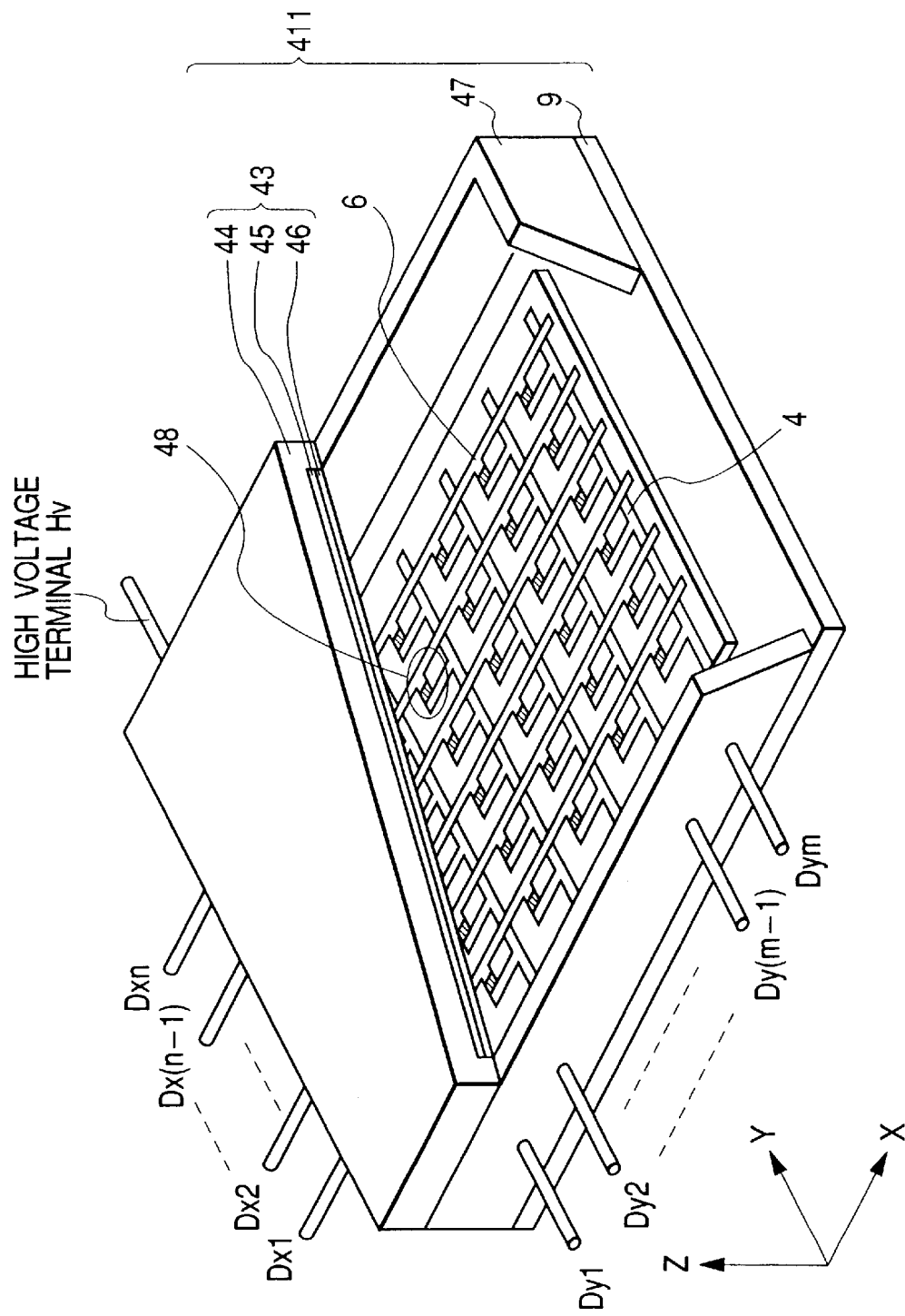
FIG. 13 is a schematic perspective view showing an image-forming apparatus to which the present invention is preferably applied.

In Example 7, a display using the envelope 411 shown in FIG. 13 was manufactured, and the pressure resistance and image of the display were evaluated.

A glass substrate 9 having device electrodes 1 and 2 made of platinum by photolithography, as shown in FIGS. 1A to 1E, was prepared. The electroconductive paste of the present invention was applied to the glass substrate 9 to form the electron source substrate 9 having Y-direction wires 4, interlevel insulating layers 5, and X-direction wires 6. The Y- and X-direction wires obtained at this time had a surface roughness Ra of 0.211 and a surface roughness Rz of 2.286. Also in Example 7, the roughnesses (Ra and Rz) were measured by the same method as in Example 1.

After the wires were complete, electroconductive thin films 3 were formed by an ink-jet method. In Example 7, an organic palladium chelating solution was applied by the ink-jet method, and heated at 350° C. for 10 min to form the electroconductive thin films 3 from Pd (FIG. 1E). The electroconductive thin film 3 formed in this way had a thickness of 10 nm and a sheet resistance of $5 \times 10^4$ $\Omega$/□. The electron source substrate 9 before forming operation was obtained.

The electron source substrate 9 before forming operation was used as a rear plate. The rear plate and a face plate were bonded through a support frame 47 with frit glass at a distance of 2 mm between the plates (distance between the metal back and X-direction wire) (FIG. 13). The interior of the envelope 411 was evacuated to about $10^{-3}$ Pa through an exhaust pipe (not shown). Then, forming operation was done for each electroconductive film 3 to form a gap in it.

After the interior of the envelope was evacuated to about $10^{-6}$ Pa, benzonitrile was introduced into the envelope to $10^{-2}$ Pa. Each electron-emitting device was energized and activated to form an electron-emitting region in the corresponding electroconductive film 3. The interior of the envelope was evacuated to a vacuum degree of $10^{-6}$ Pa. The exhaust pipe was fused by a gas burner to seal the envelope.

In an image-forming apparatus formed in the above manner, a scan signal and modulation signal (neither are shown) were supplied from signal generators to the respective electron-emitting devices through terminals Dx1 to Dxn and Dy1 to Dym to cause the devices to emit electrons. A high voltage of 10 kV was applied to a metal back (acceleration electrode) 46 through a high-voltage terminal Hv.

As a result, an electron beam was sufficiently accelerated to obtain a bright image. In addition, no discharge was observed between the face plate and rear plate while the image was displayed.

Similar to Example 7, an image-forming apparatus using Y- and X-direction wires having a surface roughness Ra of 0.187 and a surface roughness Rz of 1.875 was formed. In this apparatus, no discharge was confirmed even by applying a high voltage of 15 kV to the metal back. Hence, an electron source substrate (rear plate) having wires with a surface roughness Ra of 0.2 μm or less and a surface roughness Rz of 2 μm or less was more preferable for the image-forming apparatus.

Comparative Example 4

Using the paste used in Comparative Example 2, an electron source substrate 9 was formed by the same method as in Example 7. The surface roughnesses Ra and Rz of Y- and X-direction wires formed in Comparative Example 4 were 0.441 and 4.286, respectively. Shorting sections generated between the upper and lower wires were removed by cutting the wires with a laser processing machine. After that, forming and activation were performed to complete an image-forming apparatus. When the anode voltage applied to the metal back was set to 5 kV, some discharge phenomena were observed on the display. After discharge, no beam was emitted at the discharge positions. Further, the image display apparatus could not attain satisfactory luminance. Comparative Example 4 could not realize uniform display on the entire display.

EXAMPLE 8

Figure 10A:
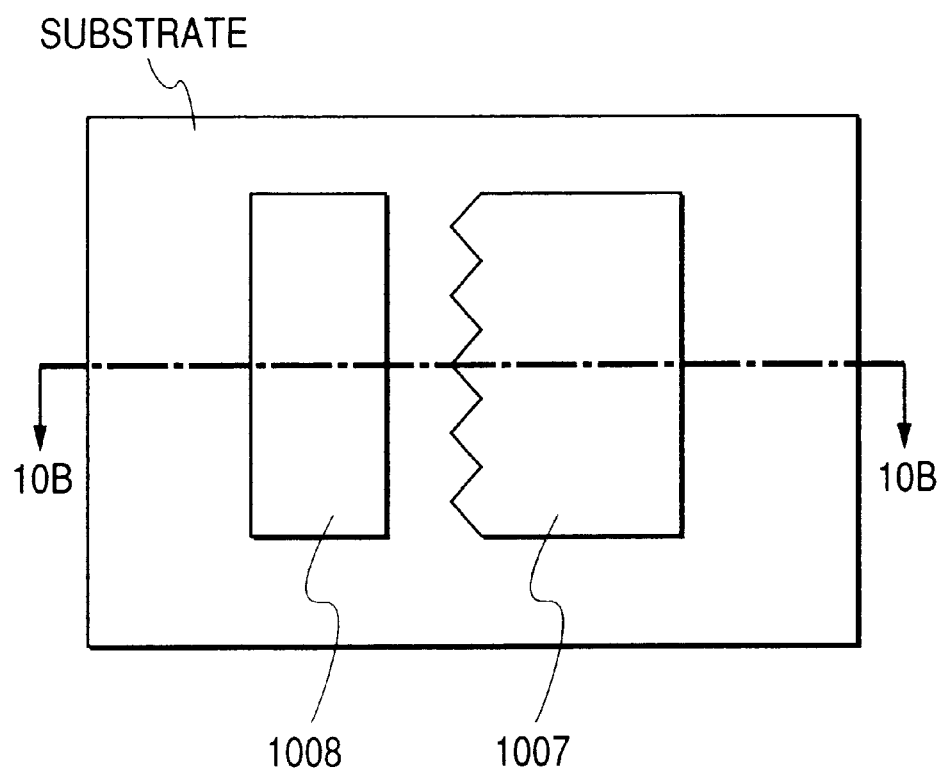
FIGS. 10A and 10B are a plan view and schematic sectional view, respectively, showing a lateral type field emission device.
Figure 10B:
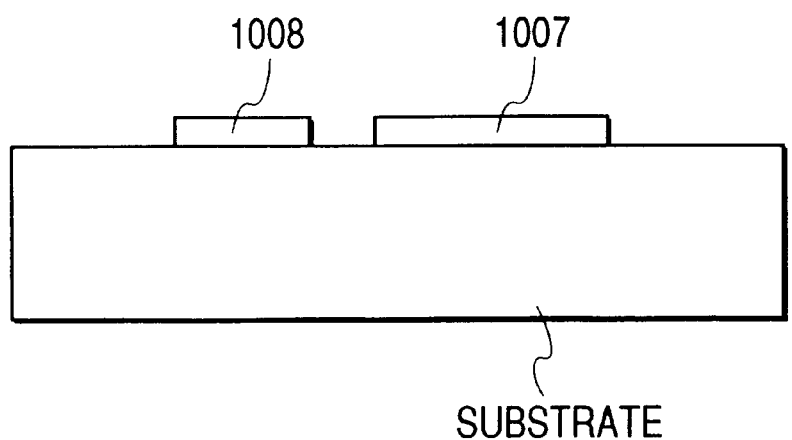

Example 8 adopted a lateral type field emission device shown in FIGS. 10A and 10B as the electron-emitting device of the image-forming apparatus formed in Example 7. In FIGS. 10A and 10B, the device comprises an emitter electrode 1007 and gate electrode 1008. The gate electrode is set at a higher voltage than the emitter electrode to emit electrons from the emitter electrode.

The image-forming apparatus of Example 8 had the same arrangement as the image-forming apparatus shown in FIG. 13 except for the electron-emitting device. The manufacturing process of the electron-emitting device corresponding to FIGS. 1A to 1E used in Example 7 will be described with reference to FIGS. 9A to 9D.

Figure 9A:
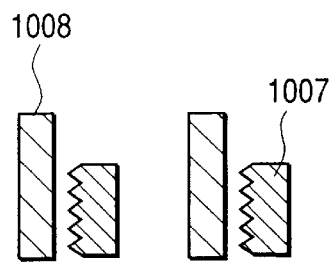
FIGS. 9A, 9B, 9C and 9D are schematic views, respectively, showing the processes in manufacturing an electron source to which the present invention is preferably applied.

As shown in FIG. 9A, a rear plate having a plurality of pairs of electrodes 1007 and 1008 was prepared.

Figure 9B:
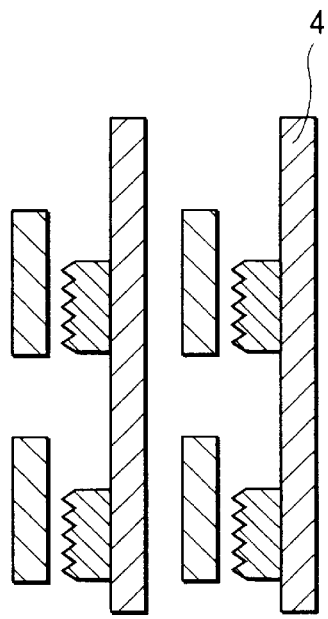

The electroconductive silver paste used in Example 2 was applied to the rear plate 9 by screen printing so as to cover part of the electrode 1007. The paste was baked to form Y-direction wires 4 having a width of 100 μm and a thickness of 12 μm (FIG. 9B).

Figure 9C:
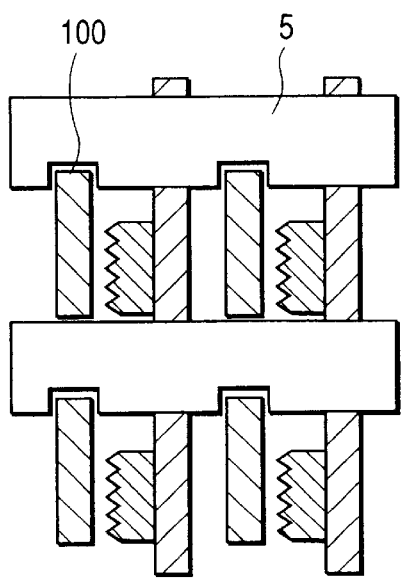

Interlevel insulating layers 5 were applied and baked by screen printing in a direction perpendicular to the Y-direction wires 4. Note that the interlevel insulating layer in Example 8 had an opening section 100 corresponding to the gate electrode 1008. The insulating paste (ink) material used was a mixture of a glass binder and resin mainly containing lead oxide. Printing and baking were repeated four times to form comb-like interlevel insulating layers 5 (FIG. 9C).

Figure 9D:
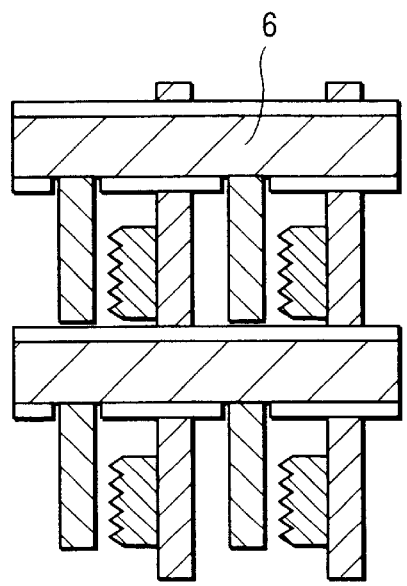
Figure 9D:
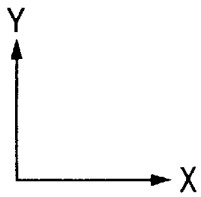

The silver paste (ink) used in Example 2 was applied to the interlevel insulating layers 5 by screen printing so as to cover part of the electrode 1008. The paste was baked to form X-direction wires 6 having a width of 100 μm and a thickness of 12 μm (FIG. 9D).

Consequently, matrix wiring on which the striped Y-direction wires (lower wires) 4 and striped X-direction wires (upper wires) 6 crossed each other through the interlevel insulating layers 5 was formed.

The rear plate 9 having an array of electron-emitting devices was completed. A face plate 43 having phosphors 45 of three primary colors (R, G, and B) and high-voltage application metal back was aligned above the rear plate. An outer frame 47 which was 1.8 mm in height and had frit glass at bonding portions was set between the face plate and rear plate. By pressurizing this structure while heating it in a vacuum chamber, the respective members were bonded (adhered) to form an envelope (airtight vessel) 411 (FIG. 13).

When this airtight vessel (image-forming apparatus) was connected to a driving circuit to drive the vessel, and a voltage of 10 kV was applied to the metal back, a high-quality image could be displayed for a long time. The shortest distance between the metal back and X-direction wire was 1.7 mm.

As has been described above, the present invention can improve the reliability of the wire for driving the electron-emitting device. In other words, the present invention can increase the manufacturing yield of the electron source substrate without short-circuiting upper and lower wires. In addition, the present invention can provide an image-forming apparatus capable of stably increasing the anode voltage (Va) in order to increase the display luminance.

What is claimed is:

1. An electron source substrate comprising:

(a) a substrate;

(b) a Y-direction wire formed on said substrate by a printing method;

(c) an X-direction wire formed on said Y-direction wire at an intersection part by the printing method so as to intersect said Y-direction wire;

(d) an insulating layer for insulating said Y-direction wire and X-direction wire at the intersection part; and (e) a plurality of electron-emitting devices connected to said X-direction wire and Y-direction wire, wherein at least one of the Y-direction wire and X-direction wire has a surface shape with a surface roughness Ra of not more than 0.3 μm and also a surface roughness Rz of not more than 3 μm.

2. An electron source substrate according to claim 1, wherein the printing method is screen printing.

3. An electron source substrate according to claim 1, wherein each electron-emitting device comprises a pair of electrodes, one of the pair of electrodes is connected to said Y-direction wire, and the other electrode is connected to said X-direction wire.

4. An electron source substrate according to claim 1, wherein said Y-direction wire and X-direction wire have a surface shape with a surface roughness Ra of not more than 0.2 μm and also a surface roughness Rz of not more than 2 μm.

5. An image-forming apparatus comprising an electron source substrate having a plurality of electron-emitting devices, and an image-forming member, said electron source substrate being said electron source substrate defined in claim 1.

6. An apparatus according to claim 5, wherein said image-forming apparatus further comprises an electrode for irradiating an image-forming member with electrons, and a field strength applied between said electrode and an X-direction wire on a rear plate is not less than 5 kV/mm.

* * * * *

UNITED STATES PATENT AND TRADEMARK OFFICE
CERTIFICATE OF CORRECTION

PATENT NO. : 6,426,733 B1
DATED : July 30, 2002
INVENTOR(S) : Shuji Yamada

It is certified that error appears in the above-identified patent and that said Letters Patent is hereby corrected as shown below:

Drawings,
Sheet 7, Fig, 8, "SECTON" should read -- SECTION --.

Column 1,
Line 23, "than," should read -- hand, --.

Column 2,
Line 35, "formed." should read -- formed --.

Column 4,
Line 20, "several" (first occurrence) should read -- several μm --; and
Line 25, "x-" should read -- X- --.

Column 5,
Line 29, "well" should read -- thorough --.

Column 7,
Line 32, "pasete" should read -- paste --.

Column 12,
Line 1, "TO 5" (close right margin);
Lines 2-3, should be deleted; and
Line 4, "¶ Comparative Examples 1 to 3" should read -- AND COMPARATIVE EXAMPLES 1 TO 3 --.

UNITED STATES PATENT AND TRADEMARK OFFICE
CERTIFICATE OF CORRECTION

PATENT NO. : 6,426,733 B1
DATED : July 30, 2002
INVENTOR(S) : Shuji Yamada

It is certified that error appears in the above-identified patent and that said Letters Patent is hereby corrected as shown below:

Column 13,
Line 48, "obtain ed" should read -- obtained --; and
Line 49, "m-thick" should read -- mm-thick --.

Signed and Sealed this

Twentieth Day of May, 2003

JAMES E. ROGAN
*Director of the United States Patent and Trademark Office*